US007580832B2

(12) United States Patent
Allamanche et al.

(10) Patent No.: US 7,580,832 B2
(45) Date of Patent: Aug. 25, 2009

(54) APPARATUS AND METHOD FOR ROBUST CLASSIFICATION OF AUDIO SIGNALS, AND METHOD FOR ESTABLISHING AND OPERATING AN AUDIO-SIGNAL DATABASE, AS WELL AS COMPUTER PROGRAM

(75) Inventors: Eric Allamanche, Nuremberg (DE); Juergen Herre, Buckenhof (DE); Oliver Hellmuth, Erlangen (DE); Thorsten Kastner, Stockheim/Reitsch (DE); Markus Cremer, Ilmenau (DE)

(73) Assignee: M2ANY GmbH, Garching (DE)

( * ) Notice: Subject to any disclaimer, the term of this patent is extended or adjusted under 35 U.S.C. 154(b) by 919 days.

(21) Appl. No.: 10/931,635

(22) Filed: Aug. 31, 2004

(65) Prior Publication Data

US 2006/0020958 A1 Jan. 26, 2006

(30) Foreign Application Priority Data

Jul. 26, 2004 (DE) ....................... 10 2004 036 154

(51) Int. Cl.
*G10L 19/02* (2006.01)
*H03M 1/18* (2006.01)

(52) U.S. Cl. ....................... 704/205; 704/230; 704/500; 341/200; 375/240.03; 375/243

(58) Field of Classification Search ................. 704/205, 704/206, 231, 500, 503, 230; 341/50, 51, 341/67, 200; 375/240.03, 243, 245
See application file for complete search history.

(56) References Cited

U.S. PATENT DOCUMENTS 4,151,469 A * 4/1979 Frutiger ...................... 375/254
4,912,758 A * 3/1990 Arbel .................... 379/406.08
5,199,078 A * 3/1993 Orglmeister ................ 704/230
5,317,672 A * 5/1994 Crossman et al. ........... 704/229

(Continued)

FOREIGN PATENT DOCUMENTS

DE 101 09 648 A1 9/2002

(Continued)

OTHER PUBLICATIONS

Sukittanon et al., "Modulation Frequency Features for Audio Fingerprinting," Acoustics, Speech and Signal Processing, Proceedings (ICASSP '02), IEEE International Conference, May 13-17, 2002, Orlando, FL, vol. 2, pp. 1773-1776.

(Continued)

*Primary Examiner*—Martin Lerner
(74) *Attorney, Agent, or Firm*—Michael A. Glenn; Glenn Patent Group

(57) ABSTRACT

An apparatus for producing a fingerprint signal from an audio signal includes a means for calculating energy values for frequency bands of segments of the audio signal which are successive in time, so as to obtain, from the audio signal, a sequence of vectors of energy values, a means for scaling the energy values to obtain a sequence of scaled vectors, and a means for temporal filtering of the sequence of scaled vectors to obtain a filtered sequence which represents the fingerprint, or from which the fingerprint may be derived. Thus, a fingerprint is produced which is robust against disturbances due to problems associated with coding or with transmission channels, and which is especially suited for mobile radio applications.

32 Claims, 4 Drawing Sheets

U.S. PATENT DOCUMENTS

| | | | | | |
|---|---|---|---|---|---|
| 5,365,553 | A | * | 11/1994 | Veldhuis et al. | 375/241 |
| 5,510,785 | A | * | 4/1996 | Segawa et al. | 341/67 |
| 5,555,273 | A | * | 9/1996 | Ishino | 375/244 |
| 5,675,385 | A | * | 10/1997 | Sugiyama | 375/240.2 |
| 5,918,223 | A | | 6/1999 | Blum et al. | |
| 5,924,064 | A | * | 7/1999 | Helf | 704/229 |
| 5,970,442 | A | * | 10/1999 | Timner | 704/219 |
| 6,029,129 | A | * | 2/2000 | Kliger et al. | 704/230 |
| 6,246,345 | B1 | * | 6/2001 | Davidson et al. | 341/51 |
| 6,377,915 | B1 | * | 4/2002 | Sasaki | 704/206 |
| 6,453,252 | B1 | * | 9/2002 | Laroche | 702/75 |
| 6,489,909 | B2 | * | 12/2002 | Nakao et al. | 341/144 |
| 6,542,869 | B1 | * | 4/2003 | Foote | 704/500 |
| 6,657,117 | B2 | * | 12/2003 | Weare et al. | 84/668 |
| 6,750,789 | B2 | * | 6/2004 | Herre et al. | 341/50 |
| 6,801,889 | B2 | * | 10/2004 | Walker | 704/226 |
| 7,174,293 | B2 | * | 2/2007 | Kenyon et al. | 704/231 |
| 7,272,556 | B1 | * | 9/2007 | Aguilar et al. | 704/230 |
| 7,328,153 | B2 | * | 2/2008 | Wells et al. | 704/231 |
| 2002/0023020 | A1 | * | 2/2002 | Kenyon et al. | 705/26 |
| 2007/0211804 | A1 | * | 9/2007 | Haupt et al. | 375/242 |

FOREIGN PATENT DOCUMENTS

| | | |
|---|---|---|
| DE | 101 34471 A1 | 2/2003 |
| EP | 1 260 968 | 11/2002 |
| WO | WO 02/065782 | 8/2002 |
| WO | WO 03/009277 | 1/2003 |

OTHER PUBLICATIONS

MPEG-7 Audio Standards (ISO/IEC JTC1/SC29/WG 11 (MPEG)): Multimedia Content Description Interface—part 4: Audio, International Standard 15938-4, ISO/IEC. Published 2002.

Seo, et al. Linear Speed-Change Resilient Audio Fingerprinting. Proc. 1st EEE Benelux Workshop on Model Based Processing and Coding of Audio. MPCA-2002. Leauven, Belgium Nov. 15, 2002.

Wang, et al. Multimedia Content Analysis, Using Both Audio and Visual Clues. IEEE Signal Processing Magazine. Nov. 2000.

Lancini, et al. Audio Content Identification by Using Perceptual Hashing. 2004 IEEE International Conference on Multimedia and Expo (ICME).

Kimura, et al. Very Quick Audio Searching: Introducing Global Pruning to the Time-Series Active Search. IEEE. 2001.

Cano, et al. A Review of Algorithms for Audio Fingerprinting. IEEE. 2002.

Papaodysseus, et al. A New Approach to the Automatic Recognition of Musical Recordings. J. Audio Eng. Soc. vol. 49. No. 1/2. Jan./Feb. 2001.

Seo, et al. Audio Fingerprinting Based on Normalized Spectral Subband Centroids. ICASSP. IEEE. 2005.

Wang, Y., Liu, Z., Huang, J-C., "Multimedia Content Analysis", IEEE Signal Processing Magazine, Nov. 2000.

* cited by examiner

APPARATUS AND METHOD FOR ROBUST CLASSIFICATION OF AUDIO SIGNALS, AND METHOD FOR ESTABLISHING AND OPERATING AN AUDIO-SIGNAL DATABASE, AS WELL AS COMPUTER PROGRAM

CROSS-REFERENCE TO RELATED APPLICATION

This application claims priority from the German patent application which was filed on Jul. 26, 2004 and is incorporated herein by reference in its entirety.

BACKGROUND OF THE INVENTION

1. Field of the Invention

The present invention generally relates to an apparatus and a method for robust classification of audio signals, as well as to a method for establishing and operating an audio-signal database, in particular to an apparatus and a method for classifying audio signals wherein a fingerprint for the audio signal is generated and evaluated.

2. Description of Prior Art

In recent years, the availability of multimedia data material has increased more and more. High-performance computers, the strong increase in availability of broad-band data networks, high-performance compression methods, and high-capacity storage media have made a major contribution to this development. There is a particularly strong increase in the number of available audio contents. Audio files coded in accordance with the MPEG1/2-Layer 3 standard, shortly referred to as MP3, are particularly widely used.

The large amount of audio data which very often represent pieces of music makes it necessary to develop apparatus and methods enabling audio data to be classified and specific audio data to be found. Since the audio data are present in various formats which do not enable exact reconstruction of the audio content in every case due to, for example, lossy compression or to transmission via a transmission channel subject to distortion, there is a need for methods which assess and/or compare audio signals on the grounds of a content-based characterization rather than on the grounds of the representation in terms of values.

One field of application of a means for content-based characterization of an audio Signal is, for example, the provision of metadata to an audio signal. This is particularly relevant in connection with pieces of music. Here, the title and the performer may be determined for a given portion of a piece of music. Thus, additional information, e.g. about the album containing the music title, as well as copyright information may also be determined.

With content-based characterization, features of an audio signal must be extracted from the present representation of an audio signal. It has proven advantageous, in particular, to associate an audio signal with a set of data which is obtained on the basis of the audio content of the audio signal and may be used for classifying, searching for or comparing an audio signal. Such a set of data is also referred to as a fingerprint.

In recent years, a number of methods for content-based indexing of audio signals have been published. By means of such apparatus, music signals, or, generally, acoustic signals may be associated with a specific class or pattern on account of a preset property. Thus, acoustic signals may be categorized by specific similarities.

The major requirements placed upon a fingerprint of an audio signal will be described in more detail below. Due to the large number of audio signals available it is necessary that the fingerprint may be produced with moderate computing expenditure. This reduces the time required for generating the fingerprint, and without this, large-scale application of the fingerprint is not possible. In addition, the fingerprint must not take up too much memory In many case it is required to store a large number of fingerprints in one database. It may be required, in particular, to keep a large number of fingerprints in the main memory of a computer. This clearly shows that the data volume of the fingerprint must be clearly smaller than the volume of data of the actual audio signal. It is required, on the other hand, that the fingerprint be characteristic for an audio piece. This means that two audio signals with different contents must also have different fingerprints. In addition, one important requirement placed upon a fingerprint is that the fingerprints of two audio signals which represent the same audio content but differ from each other by, e.g., a distortion, be sufficiently similar so as to be identified as belonging together in a comparison. This property is typically referred to as robustness of the fingerprint. This is particularly important where two audio signals that have been compressed and/or coded using different methods are to be compared. Furthermore, audio signals that have been transmitted via a channel subject to distortion are to have fingerprints which are very similar to the original fingerprint.

A number of methods have already been known by which features and/or fingerprints may be extracted from an audio signal. U.S. Pat. No. 5,918,223 discloses a method for content-based analysis, storage, retrieval and segmentation of audio information. An analysis of audio data creates a set of numerical values which is also referred to as a feature vector and which may be used to classify and rank the similarity between individual audio pieces. The features used for characterizing and/or classifying audio pieces with regard to their contents are the loudness of a piece, the pitch, the clarity of sound, the bandwidth and the so-called Mel-frequency cepstral coefficients (MFCCs) of an audio piece. The values per block or frame are stored and subject to a first time derivation. From this, statistical quantities are calculated, such as the mean value or the standard deviation, the statistical quantities being calculated for each of these features, including the first derivations, thus to describe a variation over time. This set of statistical quantities forms the feature vector. The feature vector is thus a fingerprint of the audio piece and may be stored in a database.

The specialist publication "Multimedia Content Analysis", Yao Wang et al., IEEE Signal Processing Magazine, November 2000, pages 12 to 36, discloses a similar concept to index and characterize multimedia pieces. To ensure efficient association of an audio signal with a specific class, a number of features and classifiers have been developed. Features proposed for classifying the contents of a multi-media piece are time-domain features or frequency-domain features. These include the volume, the pitch as well as the base frequency of an audio-signal form, spectral features, such as the energy content of a band with regard to the total energy content, cutoff frequencies in the spectral curve and others. In addition to short-term features relating to the so-called quantities per block of samples of the audio signal, long-term quantities are also proposed which relate to a relatively long period of time of the audio piece. Further typical features are formed by forming a time difference of the respective features. The features obtained block by block are rarely passed on as such directly for classification, since their data rate is still much too high. A common form of further processing consists in calculating short-term statistics. This includes, e.g., the formation of a mean value, a variance, and time-related correlation coefficients. This reduces the data rate and results, on the other hand, in an enhanced recognition of an audio signal.

WO 02/065782 describes a method of forming a fingerprint into a multimedia signal. The method is based on the extraction of one or several features from an audio signal. For this purpose, the audio signal is divided into segments, and each segment sees a processing by blocks and frequency bands. The band-by-band calculation of the energy, tonality and standard deviation of the spectrum of power density shall be mentioned as examples.

In addition, DE 101 34 471 and DE 101 09 648 disclose an apparatus and a method for classifying an audio signal, wherein the fingerprint is obtained on the basis of a measure for the tonality of the audio signal. Here, the fingerprint enables audio signals to be classified in a robust and content-based manner. The above documents give several possibilities of generating a tonality measure across an audio signal. In each case, the calculation of the tonality is based on a conversion of a segment of the audio signal to the spectral domain. The tonality can then be calculated in parallel for a frequency band or for all frequency bands. The disadvantage of such a method is that the fingerprint is no longer sufficiently informative as the distortion of the audio signals increases, and that it is then no longer possible to recognize the audio signal with satisfactory reliability. However, distortions occur in very many cases, in particular when audio signals are transmitted via a system exhibiting low transmission quality. Currently, this is the case, in particular, with mobile systems and/or in the event of high data compression. Such systems, such as mobile telephones, are primarily configured for bi-directional transmission of voice signals and frequently transmit music signals only with a very poor quality. This is added to by other factors which may have a negative impact on the quality of a signal transmitted, e.g. microphones of poor quality, channel interferences and transcoding effects. The consequence of a deterioration of the signal quality is a recognition performance which is highly decreased with regard to an apparatus for identifying and classifying a signal. Research has shown that in particular when using an apparatus and/or a method according to DE 101 34 471 and DE 101 09 648, by changes to the system while maintaining the recognition criterion of tonality (spectral flatness measure), no further significant improvements of the recognition performance are possible.

It may be stated that known methods for classifying audio signals and/or for forming a fingerprint of an audio signal mostly cannot meet the demands placed upon them. Problems still exist with regard to the robustness against distortions of the audio signal, also towards interferences superimposed on the audio signal.

In a plurality of current systems for storing and transmitting audio signals, high signal distortions and disturbances occur. This is the case, in particular, when a lossy data compression method or a disturbed transmission channel are used. Lossy compression is used whenever the data rate required for storing or transmitting an audio signal is to be reduced. Examples are data compression according to the MP3 standard and the methods used with digital mobile transceivers. In both cases, low data rates are achieved in that the signals are quantized as coarsely as possible for the transmission. The audio bandwidth is, in part, highly limited. In addition, signal portions which are not perceived at all by the human ear or are only perceived to a very small extent because they are, e.g., masked by other signal portions, are suppressed.

Disturbances, or interferences, on the transmission channel are very frequent with mobile voice transmission applications in common use today. More often than not, in particular, the reception quality is very poor, which becomes noticeable by means of increased noise on the audio signal transmitted. In addition, the transmission may be interrupted completely for a short time, so that a short section of an audio signal to be transmitted is missing completely. During such an interruption, a mobile phone generates a noise signal which is perceived to be less disturbing by a human user than full blanking of the audio signal. Finally, disturbances, or interferences, occur also during the handover from one mobile radio cell to another. All these interference effects must not represent too strong a corruption of the fingerprint, so that an identification of a disturbed audio signal is still possible at a high level of reliability.

Finally, the transmission of audio signals is also influenced by the frequency response characteristic of the audio part. In particular small and cheap components, as are often used with mobile devices, have a pronounced frequency response and thus distort the audio signals to be identified.

While a human listener may identify an audio signal with a high level of reliability even when the interferences and distortions described occur, the recognition performance audio signals decreases significantly, in the occurrence of disturbed, with audio signal recognition means utilizing a conventional fingerprint of an audio signal.

SUMMARY OF THE INVENTION

It is the object of the present invention to provide a concept for calculating a more robust fingerprint on the grounds of an audio signal.

In accordance with a first aspect, the invention provides an apparatus for producing a fingerprint signal from an audio signal, the apparatus having: a calculator for calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band; a scaler for scaling the energy values to obtain a sequence of scaled vectors; and a filter for temporally filtering the sequence of scaled vectors to obtain a filtered sequence which represents the fingerprint signal, or from which the fingerprint signal may be derived.

In accordance with a second aspect, the invention provides a method for producing a fingerprint signal from an audio signal, the method including the following steps: calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band; scaling the energy values to obtain a sequence of scaled vectors; and temporally filtering the sequence of scaled vectors to obtain a filtered sequence which represents the fingerprint signal, or from which the fingerprint signal may be derived.

In accordance with a third aspect, the invention provides an apparatus for characterizing an audio signal, the apparatus having: an apparatus for producing a fingerprint signal from an audio signal, the apparatus having:

a calculator for calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

a scaler for scaling the energy values to obtain a sequence of scaled vectors; and a filter for temporally filtering the sequence of scaled vectors to obtain a filtered sequence which represents the fingerprint signal, or from which the fingerprint signal may be derived; and a statement-maker about the audio content of the audio signal on the grounds of the fingerprint signal.

In accordance with a fourth aspect, the invention provides a method for characterizing an audio signal, the method including the following steps: producing a fingerprint signal using a method for producing a fingerprint signal from an audio signal, the method including the following steps:

calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

scaling the energy values to obtain a sequence of scaled vectors; and temporally filtering the sequence of scaled vectors to obtain a filtered sequence which represents the fingerprint signal, or from which the fingerprint signal may be derived; and making a statement about the audio content of the audio signal on the grounds of the fingerprint signal.

In accordance with a fifth aspect, the invention provides a method for establishing an audio database, the method including the following steps: producing a fingerprint for each audio signal to be captured in the audio database, using the method for producing a fingerprint signal from an audio signal, the method including the following steps:

calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

scaling the energy values to obtain a sequence of scaled vectors; and temporally filtering the sequence of scaled vectors to obtain a filtered sequence which represents the fingerprint signal, or from which the fingerprint signal may be derived;

for each audio signal to be captured, storing in the fingerprint as well as further information in the audio database which belongs to the audio signal, so that an association of a fingerprint and the corresponding information is given.

In accordance with a sixth aspect, the invention provides a method for obtaining information on the grounds of an audio-signal database, wherein associated fingerprint signals having been formed by a method for producing a fingerprint signal from an audio signal, the method including the following steps:

calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

scaling the energy values to obtain a sequence of scaled vectors; and temporally filtering the sequence of scaled vectors to obtain a filtered sequence which represents the fingerprint signal, or from which the fingerprint signal may be derived, are stored for several audio signals, and for obtaining a predefined search audio signals, the method including the following steps:

forming a search fingerprint signal belonging to the search audio signal using a method for producing a fingerprint signal from an audio signal, the method including the following steps:

calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

scaling the energy values to obtain a sequence of scaled vectors; and temporally filtering the sequence of scaled vectors to obtain a filtered sequence which represents the fingerprint signal, or from which the fingerprint signal may be derived;

comparing the search fingerprint signal with at least one fingerprint signal stored in the database, and making a statement about the similarity thereof.

In accordance with a seventh aspect, the invention provides a computer program having a program code for performing the method for producing a fingerprint signal from an audio signal, the method including the following steps:

calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

scaling the energy values to obtain a sequence of scaled vectors; and temporally filtering the sequence of scaled vectors to obtain a filtered sequence which represents the fingerprint signal, or from which the fingerprint signal may be derived, when the computer program runs on a computer.

The present invention is based on the findings that a fingerprint signal associated with an audio signal is robust against interferences in the case where use is made of a feature of the signal which is largely unaffected by various distortions of the signal and which is accessible, in a similar form, for acoustic perception by humans, i.e. which includes band energies and, in particular, scaled band energies, an additional degree of robustness against interferences of, e.g., a wireless channel being obtained by filtering the temporal course of the scaled band energies.

Human hearing perceives audio signals in a manner in which they are subdivided into individual frequency bands. Accordingly, it is advantageous to determine the energy of an audio signal band by band. Therefore, the inventive apparatus includes a means for calculating energy values for several frequency bands. By this means, the spectral envelope of an audio signal is represented in a technically and psycho-acoustically useful approximation.

In addition, the present invention is based on the findings that scaling of the energy values in several frequency bands both is in sync with human acoustic perception, and simplifies technological further processing of the energy values and enables the compensation of spectral signal distortions caused by a suboptimal frequency response of a transmission channel. Human acoustic perception may identify an audio signal even when individual frequency bands are elevated or attenuated in terms of their performance. In addition, a human listener may identify a signal independently of the volume. This ability of a human listener is copied by a means for scaling. Re-scaling of the band-by-band energy values is useful also for a technical application.

By applying a filter operation to the band-by-band energy values, interferences may eventually be suppressed in the same manner as is done by human auditory perception. Temporal filtering of the band-by-band energy values is more efficient here than conventional filtering of the audio signal itself, and enables the formation of a fingerprint which is more robus against signal interferences than is common with conventional apparatus.

By an inventive apparatus which combines a band-by-band determination of energy values in several frequency bands with scaling and filtering same, a robust fingerprint signal of an audio signal having a high level of validity may be produced.

An advantage of the present apparatus is that the fingerprint of an audio signal here is adjusted to human hearing. It is not only purely physical, but essentially psycho-acoustically based features that influence the fingerprint. When an inventive apparatus is applied, audio signals will then have similar fingerprints when a human listener would judge them as similar. The similarity of fingerprints correlates with the subjective perception of the similarity of audio signals as judged by a human listener.

A result of the above-mentioned considerations is an apparatus for producing a fingerprint signal on the grounds of an audio signal, which apparatus allows being able to identify and classify even audio signals exhibiting signal interferences and distortions. The fingerprints are robust, in particular, with regard to noise, interferences occurring in channels, quantization effects and artefacts due to lossy data compression. Even distortion which occurs with regard to the frequency response has no significant influence on a fingerprint which has been produced with an inventive apparatus. Thus, an inventive apparatus for producing a fingerprint associated with an audio signal is well suited for employment in connection with mobile communication means, e.g. mobile phones according to the GSM, UMTS or DECT standards.

In a preferred embodiment, compact fingerprints may be produced at a data rate of about 1 kByte per minute of audio material. This compactness allows very efficient further processing of the fingerprints in electronic data processing equipment.

Additional advantages may be achieved by further improvement of details of the present method for forming a fingerprint of an audio signal.

In a preferred embodiment, a discrete Fourier transform is performed for a segment of an audio signal by means of a fast Fourier transform. Subsequently, the amounts of the Fourier coefficients are squared and summed up band by band to obtain energy values for a frequency band. An advantage of such a method is that the energy present in a frequency band may be calculated at low expense. In addition, a corresponding operation is already contained in the MPEG7 standard and therefore does not need to be implemented separately. This reduces the development costs.

In a further preferred embodiment, the frequency bands have variable bandwidths, the bandwidth being larger at high frequencies. Such a procedure is in line with human hearing and psycho-acoustic findings.

In a further preferred embodiment, the means for scaling includes a means for taking the logarithm and a means, arranged downstream of the means for taking the logarithm, for suppressing a steady component. Such an arrangement is very advantageous, since both logarithmic normalization and an elimination of the influence of the signal level in the frequency bands is effected at low expense. A change of the signal level which is constant in time only entails a steady component in taking the algorithm. This steady component may be suppressed in a relatively simple manner by a suitable arrangement. The logarithmic normalization is very well adapted, by the way, to the human loudness perception.

BRIEF DESCRIPTION OF THE DRAWINGS

Preferred embodiments of the present invention will be described below in more detail with reference to the accompanying figures, wherein.

DESCRIPTION OF PREFERRED EMBODIMENTS

Figure 1:
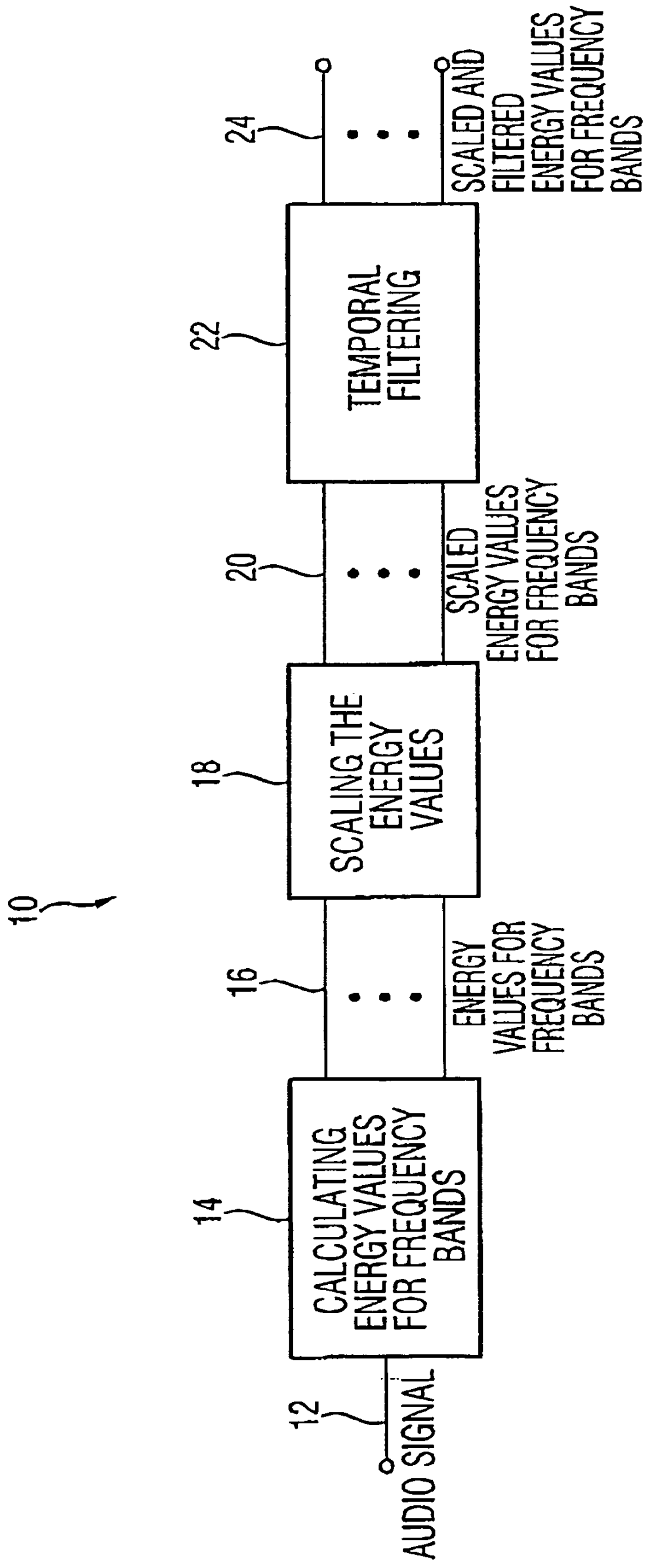
FIG. 1 shows a block diagram of an inventive apparatus for producing a fingerprint signal from an audio signal.

FIG. 1 shows a block diagram of an inventive apparatus for producing a fingerprint signal from an audio signal, the apparatus being designated by 10 in its entirety. The apparatus is fed an audio signal 12 as an input signal. In a first stage 14, energy values are calculated for frequency bands, which will then be available in the form of a vector 16 of energy values. In a second stage 18, the energy values are scaled. A vector 20 of scaled energy values for several frequency bands will then be available. At a third stage 22, this vector is time-filtered. As an output signal of the apparatus, there will be a vector 24 of scaled and filtered energy values for several frequency bands.

Figure 2:
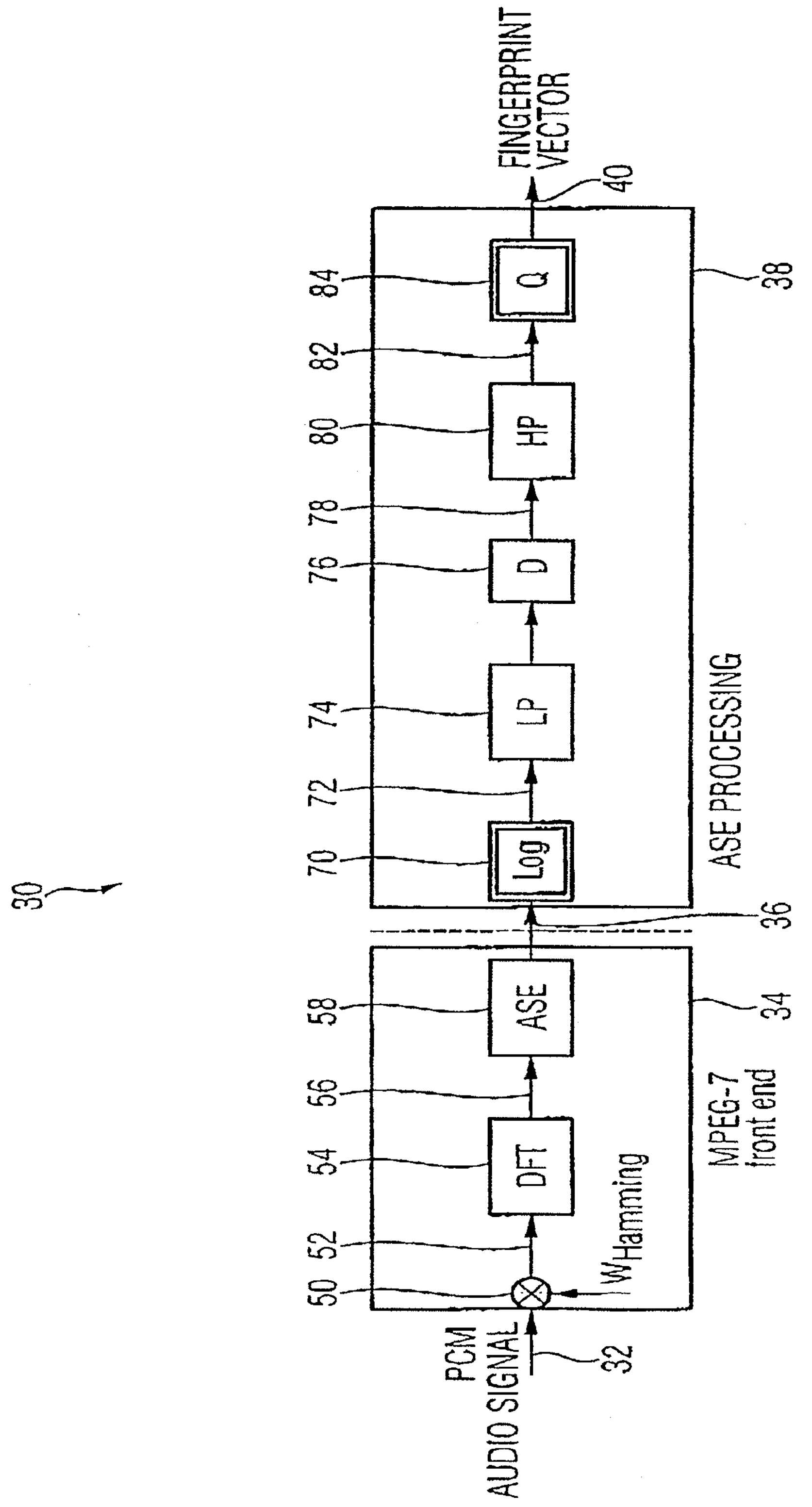
FIG. 2 shows a detailed block diagram of a further embodiment of an inventive apparatus for producing a fingerprint signal from an audio signal.

FIG. 2 shows a detailed block diagram of an embodiment of an inventive apparatus for producing a fingerprint signal from an audio signal, which apparatus is designated by 30 in its entirety. A pulse-code-modulated audio signal 32 is present at the input of the apparatus. This signal is fed to an MPEG-7 front end 34. At the output of the MPEG-7 front end, there is a sequence of vectors 36, whose components represent the energies of the respective bands this sequence of vectors is fed to a second stage 38 for processing the audio spectrum envelope. At the output thereof, there is a sequence of vectors 40 which represent, in their entirety, the fingerprint of the audio signal. The MPEG-7 front end 34 is part of the MPEG-7 audio standard and includes a means 50 for windowing the PCM-coded audio signal 32. At the output of the windowing means 50, there is a sequence of segments 52 of the audio signal, having a length of 30 ms. These are fed to a means 54 which calculates the spectra of the segments by means of a discrete Fourier transform, and at whose output Fourier coefficients 56 are present. A last/final means 58 forms the audio spectrum envelope (ASE). Here, the amounts of the Fourier coefficients 56 are squared and summed up band by band. This corresponds to calculating the band energies. The widths of the bands increase with an increase in frequency (logarithmic band classification), and may be determined by a further parameter. Thus, a vector 36 results for each segment, the entries of which represent the energy in a frequency band of a segment of a length of 30 ms. The MPFG-7 front end for calculating the band-by-band spectrum envelope of an audio segment is part of the MPEG-7 audio standard (ISO/IEC JTC1/SC29/WG 11 (MPEG): "Multimedia Content Description Interface—part 4: Audio", International Standard 15938-4, ISO/IEC, 2001).

The sequence of vectors obtained with the MPEG-7 front end is, as such, unsuitable with regard to robust classification of audio signals. Therefore, a further stage for processing the audio spectrum envelope is necessary to modify the sequence of vectors which serves as a feature, so that this feature obtains a higher robustness and a lower data rate.

The means 38 for processing the audio spectrum envelope comprises, as a first stage, a means 70 for taking the logarithm of the band-by-band energy values 36. The energy values 72, the logarithm of which has been taken, are then fed to a low-pass filter 74. Downstream of the low-pass filter 74 there is a means 76 for decimating the number of energy values. The decimated sequence 78 of energy values is fed to a high-pass filter 80. The high-pass filtered sequence 82 of spectral energy values is eventually handed over to a signal-adapted quantizer 84. At the output thereof, there is, finally, a sequence of processed spectral values 40 which, in their entirety, represent the fingerprint.

Based on the description of the structure of the apparatus for producing a fingerprint signal from an audio signal, the mode of operation will now be described in detail. The basis of the inventive apparatus for producing a fingerprint signal from an audio signal is the calculation of the band energies in several frequency bands of an audio-signal segment. This corresponds to determining the audio spectrum envelope. In the embodiment shown, this is achieved by the MPEG-7 front end 34. It is preferred, in this embodiment, for the widths of the bands to increase with an increase in frequency, and for the energy values of the frequency bands to be available as a vector 36 of band-energy values at the output of the MPEG-7 front end 34 such signal processing corresponds to human hearing, wherein perception is divided up into several frequency bands, the widths of which increase with an increase in frequency. Thus, the human auditory sensation is copied, in this respect, by the MPEG-7 front end 34.

In a further processing step, the energy values are normalized band by band. The apparatus for normalizing includes two stages, a means 70 for taking the logarithm of the energy values and a high-pass filter 80. Here, taking the logarithm fulfils two tasks. On the one hand, taking the logarithm copies human perception of loudness. Especially with high volumes, or high levels of loudness, subjective perception by humans increases by a certain amount when the audio performance just doubles. A means 70 for taking the logarithm exhibits exactly the same behavior. In addition, the means 70 for taking the logarithm has the advantage that the range of values for the energy values in a band is reduced, which enables a notation of figures which is clearly advantageous from a technical point of view. In particular, it is not necessary to use a floating-point notation, but a fixed-point notation may be used.

In addition it should be mentioned that "taking the logarithm" here ought not to be understood in a strictly mathematical sense. Especially with smaller energies in a frequency band, taking the logarithm would lead to values of very large amounts. Neither is this useful from a technical point of view, nor does it correspond to the auditory sensation of humans. On the other hand, it is useful to use, for small energy values, an approximately linear characteristic or at least to set a lower limit to the range of values. This, in turn, corresponds to human perception, wherein a hearing threshold exists for small volumes, but a roughly logarithmic perception of the sound power occurs for high volumes. It may thus be established that the dynamics of the energy values which exhibit, as experience shows, a very large range of values, is compressed to a much smaller value by taking the logarithm. The operation of taking the logarithm in accordance with the above description thus approximately corresponds to a specific loudness formation. The choice of the logarithmic base is irrelevant, since this only corresponds to a multiplicative constant that may be compensated by further signal processing, in particular by a final quantization.

In addition to compressing the dynamic range and to performing an adaptation to human hearing, scaling also fulfils the task of making the formation of a fingerprint from an audio signal independent of the level of the audio signal. To facilitate understanding, it is to be taken into account that the fingerprint may be formed both from an uncorrupted signal that was available originally, and from a signal transmitted via a transmission channel. Here, a change in the loudness, or level, may occur. In addition, in a transmission via a transmission path with a non-constant frequency response, individual frequency components are attenuated or amplified. Thus, two signals having the same contents may exhibit varying spectral energy distribution. In the following it shall be assumed that the frequency-response distortion between two signals is independent of time. It shall further be assumed that the distortion within a frequency band is approximately constant. In this case it may be assumed that the energies in a predefined frequency band only differ by a multiplicative constant which is constant in time for two signals with identical audio contents. The operation of taking the logarithm maps a multiplicative constant, which is constant in time, to an additive term which is constant in time. Thus, after taking the logarithm of the energies, an amplification and/or attenuation constant, by which two signals differ, appears as a constant additive term in the feature value. This term is filtered off from the signal by applying a high-pass filter 80 which, in particular, suppresses a steady component. Other filters which suppress a steady component may also be used. It should be pointed out, in particular, that in the present arrangement, such an adaptation occurs separately for each frequency band. Thus, the normalization of levels for each frequency band is independent, and a spectral distortion of a signal may be compensated. By the way, this corresponds to the ability of human hearing to identify spectrally distorted audio signals.

In addition, the apparatus for producing a fingerprint signal from an audio signal includes, in the embodiment present here, a low-pass filter 74. The latter filters, in the time domain, the sequence of the energy values for the frequency bands. Again, filtering occurs separately for the frequency bands. Low-pass filtering is useful, since the temporal consequences of the values, the logarithm of which has been taken, contain both components of the signal to be identified, and interferences. Low-pass filtering smoothes the temporal course of the energy values. Thus, components which are rapidly variable, which are mostly caused by interferences, are removed from the sequence of the energy values for the frequency bands. This results in an improved suppression of spurious signals.

At the same time, the amount of information to be processed is reduced by low-pass filtering by means of the low-pass filter 74, elimination being particularly focused on the high-frequency components. Due to the low-pass character of the signal, the signal may be decimated by a certain factor D by means of a decimation means 76 connected downstream of the low-pass filter 74, without losing information ("sampling theorem"). This means that only a smaller number of samples is used for the energy in a frequency band. Here, the data rate is reduced by a factor of D.

The combination of the low-pass filter 74 and the decimation means 76 thus allows not only suppression of interferences by means of low-pass filtering, but it allows, in particular, suppression of redundant information and thus also a reduction of the amount of data for the fingerprint signal. Therefore, all the information that has no direct influence on the auditory sensation of humans are suppressed. The decimation factor is determined using the low-pass frequency of the filter.

Finally it is expedient to quantize the energy values thus processed in a quantizing means 84 in a signal-adapted manner. In the process, finite integer values are associated with the real-valued energy values. The quantization intervals may be non-uniform, as the case may be, and may be determined by the signal statistics. Alternatively, it may be advantageous to use small quantization intervals for small values and large quantization intervals for high values. In particular, interconnecting the high-pass filter 80 and a quantizing means 84 provides an advantage. The high-pass filter 80 reduces the range of values of the signal. This allows quantization at a low resolution. Similarly, many values are mapped to a small number of quantization steps, which allows the quantized signal to be coded by means of entropy codes, and thus reduces the amount of data.

In addition, signal-adapted quantization may be effected by forming amplitude statistics for the signal in a pre-processing means Thus it is known which amplitude values come up with the highest frequency in the signal. The characteristics of the quantizers are determined on the basis of the relative frequencies of the respective values. Fine quantization levels are selected for frequently occurring amplitude values, whereas amplitude values and/or the associated amplitude intervals which rarely occur in signals are quantized with larger quantization levels. This affords the benefit that for a given signal with a predetermined amplitude statistic, a quantization with the smallest possible error (which is typically measured as an error behavior, or error energy) may be achieved. In contrast to the above-described non-linear quantization, wherein the magnitude of the quantization levels is substantially proportional to the associated signal value, the quantizer must be readjusted to each signal in the signal-adapted quantization, unless it is assumed that several signals have very similar amplitude statistics.

A signal-adapted quantization of the feature vectors may also be effected by quantizing the vector components with an adjusted vector quantizer. Thus, an existing correlation between the components is also implicitly taken into account.

Instead of performing a direct vector quantization, it is also possible to subject the vectors to a linear transformation prior to the quantization. This transformation is preferably configured such that a maximum de-correlation of the transformed vector components is ensured. Such a transformation may be calculated as a main-axis transformation. In this operation, the signal energy is typically concentrated in the first transformed components, so that the last values may be ignored. This corresponds to a reduction of dimensions. The transformed vectors are subsequently subjected to scalar quantization. This is preferably done in a manner which is signal-adapted for all components.

Thus, an embodiment of an apparatus has been described which assists in producing a fingerprint signal from an audio signal. A major advantage of the apparatus presented is constituted, on the one hand, by the high robustness, which allows an ability to identify GSM-coded audio signals, and, on the other hand, by the small sizes of the signatures. Signatures may be produced a rate of about 1 kByte per minute of audio material. With an average song length of about 4 minutes, this results in a signature size of 4 kByte per song. This compactness allows, among other things, to increase the number of reference signatures in the main memory of an individual computer. Thus, one million reference signatures may be readily accommodated in the main memory on newer computers.

The embodiment described with regard to FIG. 2 represents a preferred embodiment of the present invention. However, it is possible to make a large variety of changes Without departing from the essential idea of the invention.

A number of different means may be used for determining the energies in the frequency bands. The MPEG-7 front end 34 may be replaced by any other apparatus as long as it is ensured that the energy values are available at their output in several frequency bands in the segments of an audio signal. Here, the classification of the frequency bands may be changed, in particular. Instead of a logarithmic band classification, any band classification may be used, it being preferable to use a band classification which is adapted to human hearing. The length of the segments into which the audio signal is divided may also be varied. In order to keep the data rate small, segment lengths of at least 10 ms are preferred.

A variety of methods are available for scaling the energy values in the frequency bands. Instead of taking the logarithm of the spectral band energies, as set forth in the above embodiment, followed by high-pass filtering, the approximate logarithm may be taken, for example. In addition, the range of values of the initial values of the means for taking the logarithm may be limited. This affords the benefit that, in particular with very small energy values, the result of taking the logarithm is in a limited range of values. In particular, the means 70 for taking the logarithm may also be replaced by a means which is adapted even better to the loudness perception of humans. Such an improved means may take into account, in particular, the lower hearing threshold of humans as well as the subjective loudness perception.

In addition, the spectral band energies may be normalized by the overall energy. In such an embodiment, the energy values in the individual frequency bands are divided by a normalization factor, which is either a measure of the total energy of the spectrum or of the total energy of the bands considered. In this form of normalization, no more high-pass filtering needs to be performed, and it is not necessary to take the logarithm. On the contrary, the total energy in each segment is constant. Such an approach is advantageous in particular if only very little mean energy exists in individual frequency bands. Such a normalization method obtains the ratio of the energies in different bands. With some audio signals this may represent an important feature, and it is advantageous to obtain the feature. A decision as to which type of normalization is expedient may be made as a result of an uncorrupted audio signal, i.e. of an audio signal which is not distorted with regard to the frequency response. The normalization of the spectral band energies by the total energy has been proposed, e.g., in Y. Wang, Z. Liu and J. C. Huang: "Multimedia Content Analysis", IEEE Signal Processing Magazine, 2000.

It is also possible to perform local spectral normalization. A normalization of this kind has been described in J. Soo Seo, J. Haitsma and T. Kalker: "Linear Speed-change Resilient Audio Fingerprinting", Proceedings $1^{st}$ IEEE Benelux Workshop on Model Based Processing and Coding of Audio", Leuven, Belgium, 2002.

Various methods may be employed for temporal smoothing of the energy values in successive segments. In the above-described embodiment, a digital low-pass filter is used. In addition, it is also possible to calculate modulation spectra for the energy values. Here, low-frequency modulation coefficients describe the smoothed course of the spectral energy values. The use of modulation spectra for audio recognition has been described, e.g., by S. Sukittanon and L. Atlas: "Modulation Frequency Features for Audio Fingerprinting", IEEE ICASSP 2002, pp. 1773-1776, Orlando, Fla., USA, 2002. In comparison, smoothing of the temporal course of the energy values in successive segments is made possible by calculating a sliding mean value. Thus, a mean value is calculated from a specific number of successive features. In the MPEG-7 standard, e.g., this is made possible by the "scalable series". This type of smoothing, however, has the drawback that it may entail aliasing, in the context of signal theory. This effect, however, may be suppressed, for the most part, by a suitably dimensioned low-pass filter.

In addition, it is possible to dispense with the decimation stage. This is useful, in particular, if the segments of the audio signal which have been processed are very long. In this case, the data rate is already sufficiently small by itself, and no more decimation is required. The advantage of such an arrangement is that in the entire apparatus, the same data rate applies for deriving a fingerprint from the spectral energy values. This facilitates a technical implementation, in particular in the form of a computer program.

The high-pass filter 80 may vary within a broad range. A very simple embodiment consists in using the differences of two successive values, respectively. Such an embodiment has the advantage that it is very simple to realize from a technical point of view.

Means 84 for quantizing may be modified within a broad range. It is not absolutely necessary and may be dispensed with in an embodiment. This reduces the expense incurred in the implementation of the inventive apparatus. On the other hand, in a further embodiment, a quantizing means may be used which is adapted to the signal and wherein the quantization intervals are adapted to the amplitude statistics of a signal. Thus, the quantization error for a signal becomes minimal. A vector quantization may also be adapted to the signal and/or may be combined with a linear transform.

In addition, it is possible to combine the quantizing means with an apparatus for high-pass filtering and/or for forming differences. In many cases, a formation of differences reduces the range of values of the signals to be quantized. Changes in the energy values are emphasized, signals constant in time are made to be zero. If a signal exhibits nearly unchanged values in a sufficiently large number of segments successive in time, the difference is approximately zero. Accordingly, the output signal of the quantizer is also zero. If coding the quantized signals is effected using an entropy code wherein a short symbol is associated with frequently occurring signal values, the waveform may be stored with a minimum outlay in terms of storage space.

In a further embodiment, the scalar quantizers individually quantizing the energy values processed for each frequency band may be replaced by a vector quantizer. Such a vector quantizer associates an integer index value with a vector which includes the processed energy value in the frequency bands used (e.g. in four frequency bands). The result for each vector of energy values is now only a scalar value. Thus, the amount of data at hand is smaller than with the separate quantization of the energy values in the frequency bands, since correlations within the vectors are taken into account.

In addition, a form of quantization may be used wherein the widths of quantization levels is larger for large energy values than for small energy values. The result is that even small signals may be quantized with a satisfactory resolution. It is possible, in particular, to design the quantizing means such that the maximum relative quantization error of roughly the same magnitude for small and large energy values.

In addition, in another embodiment, the order of the processing means may be changed In particular, means that cause linear processing of the energy values may be exchanged. However, it is expedient for a decimation means which may be present to be arranged immediately downstream of a low-pass filter. Such a combination of low-pass filtering and decimation is useful, since disturbing influences due to under-sampling may be avoided most effectively. Moreover, a high-pass filter must be arranged downstream of the means for taking the logarithm in order to be able to suppress the steady component that may result when taking the logarithm.

The inventive apparatus for producing a fingerprint signal from an audio signal may be employed advantageously for establishing and operating an audio database.

Figure 3:
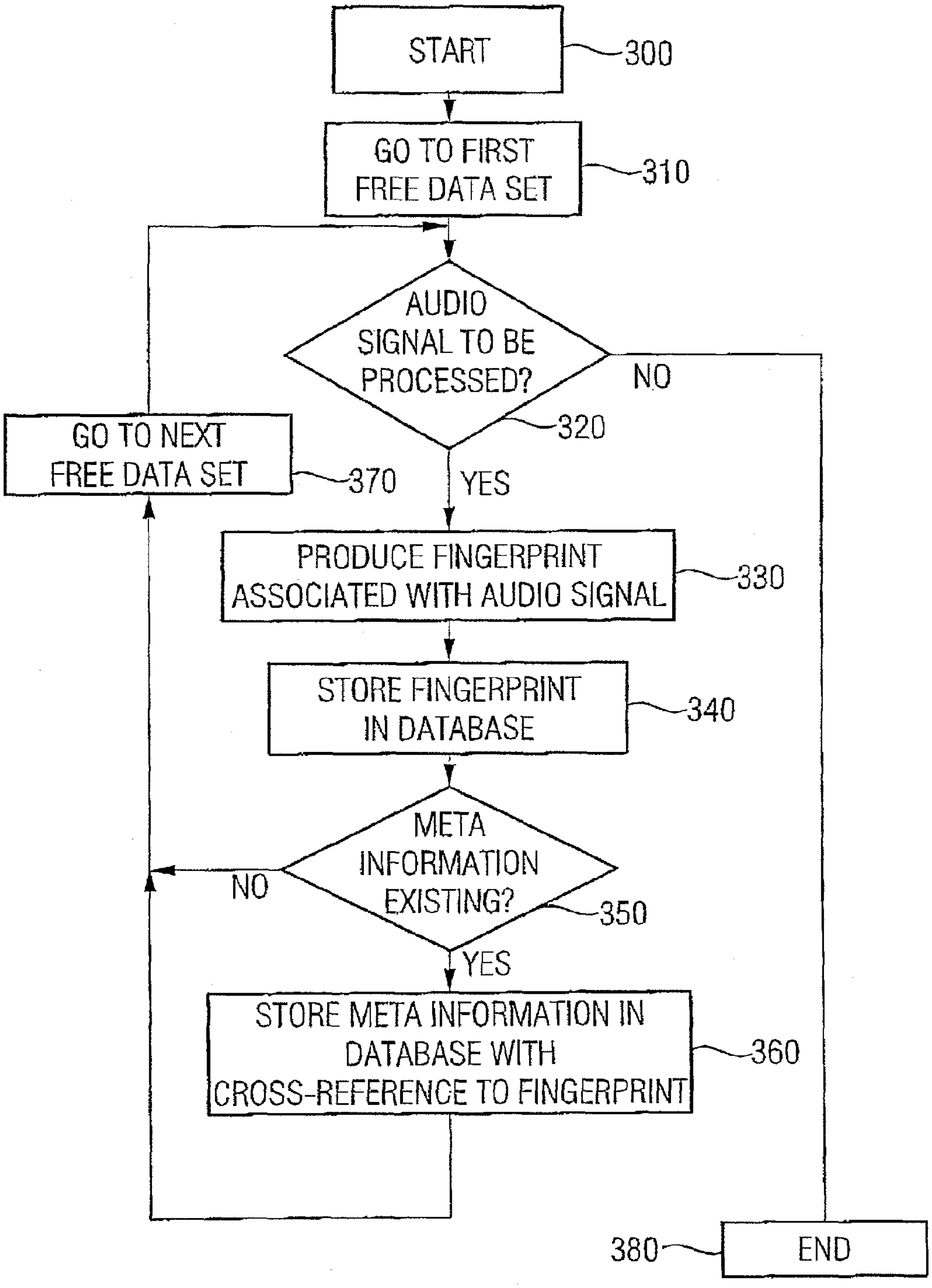
FIG. 3 shows a flowchart of an embodiment of a method for establishing an audio database.

FIG. 3 shows a flowchart of an embodiment of a method for establishing a database. What is described here is the approach to producing a new data set on the grounds of an audio signal. Once the process has started (300), the first free data set is initially searched for (310). Subsequently, a search is made whether an audio signal is present for processing (320). If this is so, a fingerprint signal associated with the audio signal is produced (330) and stored in the database (340). If, additionally, there is still information (so-called metadata) about the audio signal (350), it is also stored (360) into the database, and a cross-reference to the fingerprint is made. Here, storing of a data set is completed. In the database application, a pointer is then set to the nearest free data set (370). If further audio signals are to be processed, the process described above is cycled through several times. If there are no more audio signals to be processed, the process is terminated (380).

Figure 4:
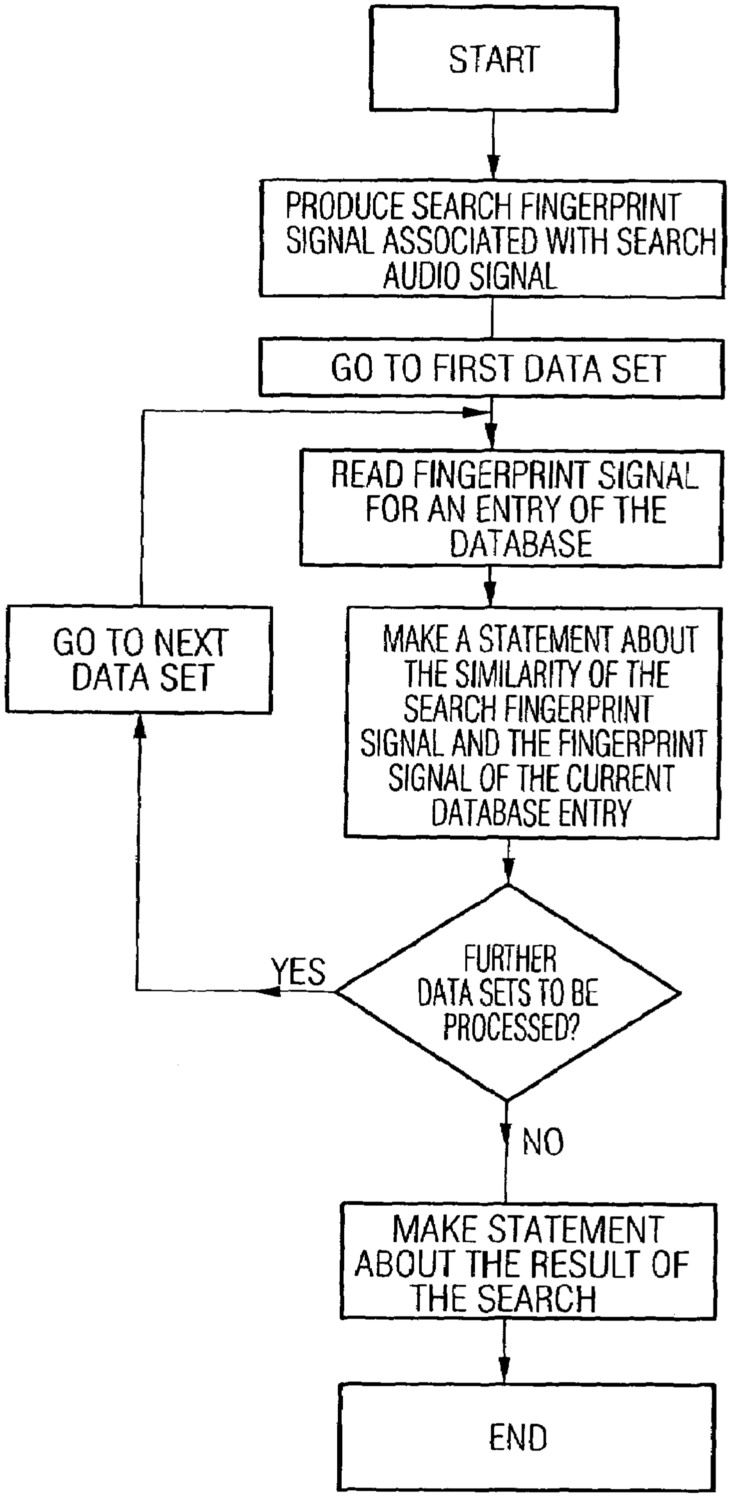
FIG. 4 shows a flowchart of an embodiment of a method for obtaining information on the grounds of an audio-signal database.

FIG. 4 shows a flowchart of an embodiment of a process for obtaining information on the grounds of an audio-signal database. It is the aim of this process to obtain information about a predefined search audio signal from a database. In a first step, a search fingerprint is produced (400) from the search audio signal. For this purpose, an apparatus and/or a method in accordance with the present invention is employed. Subsequently, the data-set pointer of the database is directed at the first data set to be browsed (410). The fingerprint signal for a database entry, which signal is stored in the database, is then read out from the database (420). On the grounds of the search fingerprint signal and the read-out fingerprint signal of the current database entry, a statement is now made about the similarity of the audio signals (430). If further data sets are to be processed (440), reading out the fingerprint signal and comparing it with the search fingerprint signal is repeated for the further data sets. If all data sets to be browsed have been processed, a statement is made about the result of the search (450), wherein the statements made for each of the data sets to be browsed are taken into account.

In a preferred embodiment, the inventive method for browsing an audio-signal database is expanded to include outputting of meta-information belonging to the audio signal. This is useful, for example, in connection with pieces of music. By means of a given portion of a music title, a database may be browsed using the described method. Once a sufficient similarity of the unknown music title with a music title captured in the database is recognized, the metadata stored in the database may be output. This data may include, e.g., the title and performer of the piece of music, information about the album containing the title, as well as information about supply sources and copyrights. Thus it is possible to obtain all information required about a piece of music on the basis of a portion thereof.

In an expansion of the method described, the database may also contain the actual music data. Thus, the entire piece of music may be delivered back starting from the knowledge of a portion of the music.

The above-described method for operating an audio database is, of course, not restricted to pieces of music. On the contrary, all kinds of natural or technical sounds may be classified accordingly. An audio database based on an inventive method may thus deliver back corresponding metadata and enable the recognition of a large variety of acoustic signals.

The methods for establishing and operating an audio-signal database which have been described with reference to FIGS. 3 and 4 differ from conventional databases substantially in the manner in which a fingerprint signal is produced. The inventive method for producing a fingerprint signal enables the generation of a fingerprint signal which is very robust against disturbing influences, on the basis of the content of an audio signal. Thus, the recognition of an audio signal that has previously been stored into the database is possible with a high level of reliability even if the audio signal used for comparison has disturbances superimposed on it or is distorted in its frequency response. In addition, the magnitude of an inventive fingerprint signal is only about 4 kByte per song. This compactness affords the benefit that the number of reference signatures in the main memory of a single computer is increased as compared with other methods. A million fingerprint signals may be accommodated in the main memory on a modern computer. Thus, the search for an audio signal is not only very reliable but may also be performed in a very fast and resource-efficient manner.

The processes described with reference to FIGS. 3 and 4 may be varied within a broad range. In particular, any method suitable for establishing and operating a database may be employed, as long as it is ensured that the inventive fingerprint signal is used. It is feasible, for example in individual solutions, to produce the fingerprint signal from the database not until it is actually required. This is advantageous if an audio database fulfils several tasks at once and if the comparison of two audio signals is required only as an exception. Moreover, additional search criteria may readily be included. In addition, it is possible to associate entries of the database with a class of similar audio signals on the grounds of the fingerprint signal, and to store the information about the association with a class in the database.

The present invention thus provides an apparatus and a method for producing a fingerprint signal from an audio signal, as well as apparatus and methods which allow an audio signal to be characterized, and/or a database to be established and operated, on the grounds of this fingerprint. Here, the production of the fingerprint signal takes into account both the aspects relevant for technical realization and a low expense in terms of implementation, a small magnitude of the fingerprint signal and a robustness against disturbances as well as psycho-acoustics phenomena. The result is a fingerprint signal which is very small in relation to the data volume and which characterizes the content of an audio signal and enables the audio signal to be recognized with a high level of reliability. The use of the fingerprint signal is suitable both for classifying an audio signal and for database applications.

Depending on the circumstances, the inventive method for producing a fingerprint signal from an audio signal may be implemented in hardware or in software. The implementation may be effected on a digital storage medium, in particular a disc or CD with electronically readable control signals which may cooperate with a programmable computer system such that the corresponding process is executed. Generally, the invention thus also consists in a computer-program product with a program code, stored on a machine-readable carrier, for performing the inventive method if the computer-program product runs on a computer. In other words, the invention may thus also be realized as a computer program with a program code for performing the method when the computer program runs on a computer.

In addition, the present invention may also be developed further through a number of detail improvements.

In an embodiment, a segment of the audio signal has a length in time of at least 10 ms. Such a configuration reduces the number of energy values to be formed in the individual frequency bands in comparison with methods using a shorter segment length. The amount of data at hand is smaller, and subsequent processing of the data requires less expense. It has been found, however, that a segment length of about 20 ms is sufficiently small with regard to human perception. Shorter audio components in a frequency band do not occur in typical audio signals and hardly contribute to human perception of audio-signal content.

In one embodiment, the means for scaling is designed to compress a range of values of the energy values so that a range of values of compressed energy values is smaller than a range of values of non-compressed energy values. Such an embodiment provides the advantage that the dynamic range of the energy values is reduced. This allows a so-called number representation. Thereby, in particular, the need to use a floating-point representation is avoided. In addition, such an approach takes into account a dynamic compression which also takes place in the human ear.

In a further embodiment, scaling may go hand in hand with normalizing the energy values. If a normalization is performed, the dependence of the energy values on the control-recording level of the audio signal is eliminated. This substantially corresponds to the ability of human hearing to adapt to loud and soft signals alike and to ascertain the correspondence, in terms of content, between two audio signals independently of the current playback volume.

In accordance with one embodiment it is either possible to restrict the range of values to an interval between a lower limit and an upper limit, or to take the logarithm of the energy values. Both approaches lead to robust fingerprints of an audio signal. Taking the logarithm here is more closely related to the properties of human auditory perception.

In one embodiment, the means for scaling is configured to scale the energy values in accordance with the human loudness perception. Such an approach affords the benefit that both soft and loud signals are assessed very precisely in accordance with the perceptive faculty of humans.

In accordance with a preferred embodiment, the means for scaling the energy values is configured to scale the energy values band by band. The scaling on a band-by-band basis here corresponds to the ability of humans to recognize an audio signal even if it distorted in relation to the frequency response.

In one embodiment, a steady component is suppressed by a high-pass filter connected downstream of the means for taking the logarithm. This allows achieving identical control-recording levels in all frequency bands within a predetermined range of tolerance. The range of tolerance admissible for evaluating the spectral energy values here is about ±3 db.

In a further embodiment, the means for scaling is configured to perform a normalization of the energy value by the total energy By means of such an arrangement, the dependence on the signal level may be eliminated, just like in the band-by-band normalization.

In a further embodiment, the means for temporal filtering of the sequence of scaled vectors includes a means configured to achieve temporal smoothing of the sequence of scale vectors. This is advantageous since disturbances on the audio signal mostly result in a fast change of the energy values in the individual frequency bands. In comparison therewith, information-bearing components mostly change at a lower rate. This is due to the characteristic of audio signals which represent, in particular, a piece of music.

The means for temporal smoothing of the sequence of scaled vectors is, in one embodiment, a low-pass filter with a cutoff frequency of less than 10 Hz. Such a dimensioning is based on the findings that the information-bearing features of a voice or music signal change at a comparatively low rate, i.e. on a time scale of more than 100 ms.

In a further embodiment, the means for temporal filtering of the sequence of scale vectors includes a means for forming the difference between two energy values successive in time. This is an efficient implementation of a high-pass filter.

In a further embodiment, the apparatus for producing a fingerprint signal from an audio signal comprises a low-pass filter as well as a decimation means connected to the output of the low-pass filter. The decimation means is configured to reduce the number of vectors derived from the audio signal such that a Nyquist criterion is met. Such an embodiment, in turn, is based on the findings that only temporally slow changes of the energy values in the individual frequency bands have a high information content concerning the audio signal to be classified. Accordingly, fast changes of the energy values may be suppressed by a low-pass filter. Thus, the sequence of energy values only has low-frequency components for a frequency band. Accordingly, a reduction of the sampling rate is possible in accordance with the sampling theorem. After the decimation, the scaled and filtered sequence of vectors only has one vector per D segments instead of, originally, one vector per segment. Here, D is the decimation factor. The consequence of such an approach is a reduction of the data rate of the fingerprint signal. Thus, the removal of redundant information may, at the same time, be combined with a reduction of the amount of data. Such an approach reduces the magnitude of the resulting fingerprint of a given audio signal and thus contributes to efficient utilization of the inventive apparatus.

In a further embodiment, the inventive apparatus includes a means for quantizing. Thus it is possible to effect, in addition to scaling, a second conversion of the range of values of the energy values.

In a further embodiment, a high-pass filter is connected upstream of the means for quantizing, the high-pass filter being configured to reduce the amounts of-the values to be quantized. This allows a reduction of the number of bits required for representing these values in a non-signal-adapted quantizer. Thus, the data rate is reduced. In a signal-adapted quantizer, the number of bits does not depend on the amounts of the values to be quantized.

In addition, entropy coding is preferred. This involves associating short code words with frequently occurring values, whereas long code words are associated with rarely occurring values. The result is a further reduction of the amount of data.

In a further embodiment, the means for quantizing may be configured such that the width of quantization levels is larger for large energy values than for small energy values. This, too, entails a reduction of the number of bits required for representing an energy value, very small signals continuing to be represented with sufficient accuracy.

In one embodiment, in particular, the means for quantizing may be configured such that the maximum relative quantization error is the same for large and small energy values within a tolerance range. The relative quantization error is defined, for example, as the ratio of the absolute quantization error for an energy value and the un-quantized energy value. The maximum is formed in a quantizing interval. An interval of ±3 db about a predefined value may be used as the tolerance range. The maximum relative quantization error also depends on the bit width of the quantizer.

The embodiment described represents an example of signal-adapted quantizing. In the field of signal processing, however, a variety of additional forms of signal-adapted quantizing are known. In the inventive apparatus, any of the embodiments may be employed as long as it is ensured that it is adapted to the statistical properties of the energy values filtered.

In one embodiment, the means for quantizing may be configured such that the width of quantization levels is larger for rare energy values than for frequent energy values. This, too, entails a reduction of the number of bits required for representing an energy value, and/or a smaller quantization error.

In a further embodiment, the means for quantizing is configured such that it associates a symbol with a vector of energy values processed. This symbol represents a vector quantizer. With the help of such a vector quantizer, a further reduction of the amount of data is made possible.

Finally it is to be stated that the inventive apparatus and/or and inventive method comprise a very broad field of application. In particular, the above-described concept for producing a fingerprint may be employed in pattern-recognizing systems so as to identify or to characterize signals. In addition, the concept may also be used in connection with methods determining similarities and/or distances between data sets. These may be database applications, for example.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An apparatus for producing a fingerprint signal from an audio signal, comprising:

a calculator for calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

a scaler for scaling the energy values to obtain a sequence of scaled vectors;

wherein the scaler includes a means for taking the logarithm and a suppressor for suppressing a steady component which is connected downstream of the means for taking the logarithm, wherein the suppressor for suppressing a steady component includes a high-pass filter;

a low pass filter for temporally filtering the sequence of scaled vectors to obtain a filtered sequence which represents the fingerprint signal, or from which the fingerprint signal maybe derived; and a quantizer connected downstream of the filters and configured to quantize the filtered sequence or a signal based thereon so as to derive the fingerprint signal from the filtered sequence, wherein the quantizer is configured such that a width of a quantization level for a high energy value is larger than a width of a quantization level for a small energy value.

2. The apparatus as claimed in claim 1, wherein one segment of the audio signal has a length in time of at least 10 ins.

3. The apparatus as claimed in claims 1 or 2, wherein the calculator for calculating energy values for frequency bands is configured to perform a discrete Fourier transform (DFT) by means of a fast Fourier transform (FFT) on the audio signal of a segment, to obtain Fourier coefficients, to square amounts of the Fourier coefficients, to obtain squared amounts of the Fourier coefficients, and to sum up the squared amounts of the Fourier coefficients band by band to obtain energy values for a frequency band.

4. The apparatus as claimed in claim 1, wherein the frequency bands have a variable bandwidth, wherein a bandwidth with frequency bands having higher frequencies is larger than a bandwidth with frequency bands having lower frequencies.

5. The apparatus as claimed in claim 1, wherein the scaler is configured to compress a range of values of the energy values such that a range of values of compressed energy values is smaller than a range of non-compressed energy values.

6. The apparatus as claimed in claim 1, wherein the scaler is configured to normalize the energy values.

7. The apparatus as claimed in claim 1, wherein the scaler is configured to scale the energy values to a range of values between a lower limit and an upper limit, or to take a logarithm of the energy values.

8. The apparatus as claimed in claim 1, wherein the scaler is configured to scale the energy values so as to correspond to the human loudness perception.

9. The apparatus as claimed in claim 1, wherein the scaler includes a means for taking the logarithm and a suppressor for suppressing a steady component which is connected downstream of the means for taking the logarithm.

10. The apparatus as claimed in claim 9, wherein the suppressor for suppressing a steady component includes a high-pass filter.

11. The apparatus as claimed in claim 1, wherein the scaler is configured to perform a normalization of the energy values using a total energy created by forming a sum of several energy values, the normalization being performed by dividing the energy values, in a band-by-band manner, by a normalization factor which is identical with the total energy.

12. The apparatus as claimed in claim 1, wherein the filter for temporally filtering the sequence of scaled vectors is configured to achieve temporal smoothing of the sequence of scaled vectors.

13. Apparatus as claimed in claim 1, wherein the filter for temporal filtering includes a low-pass filter having a cutoff frequency of less than 50 Hz.

14. The apparatus as claimed in claim 1, wherein the filter for temporally filtering the sequence of scaled vectors includes a high-pass filter with a cutoff frequency of less than 10 Hz.

15. The apparatus as claimed in claim 1, wherein the filter for temporally filtering the sequence of scaled vectors includes a means for forming the difference between two energy values in the same frequency band which are successive in time.

16. The apparatus as claimed in claim 1, wherein the filter for temporal filtering includes a low-pass filter as well as a decimation means connected to an output of the low-pass filter and configured to reduce the number of vectors derived from the audio signal.

17. The apparatus as claimed in claim 1, wherein the filter for temporal filtering comprises a high-pass filter configured to reduce the range of values of the values to be quantized.

18. The apparatus as claimed in claim 1, wherein the quantizer comprises such a classification of the quantization levels that a maximum relative quantization error is identical for large and small energy values within a tolerance range.

19. The apparatus as claimed in claim 18, wherein the tolerance range is ± 3 db.

20. The apparatus as claimed in claim 1, wherein the quantizer is configured to use quantization levels on the grounds of an amplitude statistic, the quantization levels being adapted in accordance with the amplitude statistic of the signal to be quantized, which statistic includes a statement about a relative frequency of values of the signal to be quantized, a fine classification of the quantizing steps being effected for a range of values with values of the signal to be quantized having a high relative abundance, and a coarse classification of the quantization levels being effected for a range of values with values of the signal to be quantized having a low relative abundance.

21. The apparatus as claimed in claim 1, wherein the quantizer is configured such that it associates a symbol with a vector of the filtered sequence.

22. A method for producing a fingerprint signal from an audio signal, comprising:

calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

scaling the energy values to obtain a sequence of scaled vectors wherein scaling comprises taking the logarithm of the energy values; and suppressing, downstream with respect to taking the logarithm, a steady component, using a high-pass filtering operation;

temporally low-pass filtering the sequence of scaled vectors to obtain a filtered sequence which represents the fingerprint signal, or from which the fingerprint signal may be derived; and quantizing the filtered sequence or a signal based thereon so as to derive the fingerprint signal from the filtered sequence or from the signal based thereon, wherein a width of a quantization level for a high energy value is larger than a width of a quantization level for a small energy value.

23. An apparatus for characterizing an audio signal, comprising:

an apparatus or producing a fingerprint signal from an audio signal, comprising:

a calculator for calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

a scaler for scaling the energy values to obtain a sequence of scaled vectors wherein the scaler includes a means for taking the logarithm and a suppressor for suppressing a steady component which is connected downstream of the means for taking the logarithm, wherein the suppressor for suppressing a stead component includes a high-pass filter;

a low pass filter for temporally filtering the sequence of scaled vectors to obtain a filtered sequence which represents he fingerprint signal, or from which the fingerprint signal may be derived; and a quantizer connected downstream of the filters and configured to quantize the filtered sequence or a signal based thereon so as to derive the fingerprint signal from the filtered sequence, wherein the quantizer is configured such that a width of a quantization level for a high energy value is larger than a width of a quantization level for a small energy value; and a statement-maker about the audio content of the audio signal on the grounds of the fingerprint signal.

24. A method for characterizing an audio signal, comprising:

producing a fingerprint signal using a method for producing a fingerprint signal from an audio signal, the method comprising:

calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

scaling the energy values to obtain a sequence of scaled vectors wherein scaling comprises taking the logarithm of the energy values;

suppressing, downstream with respect to taking the logarithm, a steady component, using a high-pass filtering operation:

temporally low-pass filtering the sequence of scaled vectors to obtain a filtered sequence which represents the fingerprint signal, or from which the fingerprint signal may be derived; and quantizing the filtered sequence or a signal based thereon so as to derive the fingerprint signal from the filtered sequence or from the signal based thereon, wherein a width of a quantization level for a high energy value is larger than a width of a quantization level for a small energy value, and making a statement about the audio content of the audio signal on the grounds of the fingerprint signal.

25. A method for establishing an audio database, comprising:

producing a fingerprint for each audio signal to be captured in the audio database, using the method for producing a fingerprint signal from an audio signal, the method comprising:

calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

scaling the energy values to obtain a sequence of scaled vectors wherein scaling comprises taking the logarithm of the energy values;

suppressing, downstream with respect to taking the logarithm, a steady component, using a high-pass filtering operation;

temporally low-pass filtering the sequence of scaled vectors to obtain a filtered sequence which represents the fingerprint signal, or from which the fingerprint signal may be derived; and quantizing the filtered sequence or a signal based thereon so as to derive the fingerprint signal from the filtered sequence or from the signal based thereon, wherein a width of a quantization level for a high energy value is larger than a width of a quantization level for a small energy value, for each audio signal to be captured, storing in the fingerprint as well as further information in the audio database which belongs to the audio signal, so that an association of a fingerprint and the corresponding information is given.

26. A method for obtaining information on the grounds of an audio-signal database, wherein associated fingerprint signals having been formed by a method for producing a fingerprint signal from an audio signal, the method comprising:

calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

scaling the energy values to obtain a sequence of scaled vectors wherein scaling comprises taking the logarithm of the energy values;

suppressing, downstream with respect to taking the logarithm, a steady component, using a high-pass filtering operation;

temporally low-pass filtering the sequence of scaled vectors to obtain a filtered sequence which represents the fingerprint signal, or from which the fingerprint signal may be derived; and quantizing the filtered sequence or signal based thereon so as to derive the fingerprint signal from the filtered sequence or from the signal based thereon, wherein a width of a quantization level for a high energy value is larger than a width of a quantization level for a small energy value, are stored for several audio signals, and for obtaining a predefined search audio signals, the method comprising:

forming a search fingerprint signal belonging to the search audio signal using a method for producing a fingerprint signal from an audio signal, comprising:

calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

scaling the energy values to obtain a sequence of scaled vectors wherein scaling comprises taking the logarithm of the energy values;

suppressing, downstream with respect to taking the logarithm, a steady component, using a high-pass filtering operation;

temporally low-pass filtering the sequence of scaled vectors to obtain a filtered sequence which represents the fingerprint signal, or from which the fingerprint signal may be derived; and quantizing the filtered sequence or a signal based thereon so as to derive the fingerprint signal from the filtered sequence or from the signal based thereon, wherein a width of a quantization level for a high energy value is larger than a width of a quantization level for a small energy value, comparing the search fingerprint signal with at least one fingerprint signal stored in the database, and making a statement about the similarity thereof.

27. The method as claimed in claimed 29, further comprising:

outputting metadata to the audio signals on which the fingerprint signals stored in the database are based, depending on the statement about the similarity of the search fingerprint signal with the fingerprint signals stored in the database.

28. A computer readable medium having stored thereon a computer program having a program code for performing the method for producing a fingerprint signal from an audio signal, the method comprising:

calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

scaling the energy values to obtain a sequence of scaled vectors wherein scaling comprises taking the logarithm of the energy values;

suppressing, downstream with respect to taking the logarithm, a steady component, using a high-pass filtering operation;

temporally low-pass filtering the sequence of scaled vectors to obtain a filtered sequence which represents the fingerprint signal, or from which the fingerprint signal may be derived, and quantizing the filtered sequence or a signal based thereon so as to derive the fingerprint signal from the filtered sequence or from the signal based thereon, wherein a width of a quantization level for a high energy value is larger than a width of a quantization level for a small energy value when the computer program runs on a computer.

29. An apparatus for producing a fingerprint signal from an audio signal, comprising:

a calculator for calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

a scaler for scaling the energy values to obtain a sequence of scaled vectors wherein the scaler includes a means for taking the logarithm and a suppressor for suppressing a steady component which is connected downstream of the means for taking the logarithm, wherein the suppressor for suppressing a steady component includes a high pass filter;

a low-pass filter for temporally filtering the sequence of scaled vectors to obtain a filtered sequence which represents the fingerprint signal, or from which the fingerprint signal may be derived; and a quantizer connected downstream of the filters and configured to quantize the filtered sequence or a signal based thereon so as to derive the fingerprint signal from the filtered sequence, wherein the quantizer is configured to use quantization levels on the grounds of an amplitude statistic, the quantization levels being adapted in accordance with the amplitude statistic of the signal to be quantized, which statistic includes a statement about a relative frequency of values of the signal to be quantized, a fine classification of the quantizing levels being effected for a range of values with values of the signal to be quantized having a high relative abundance, and a coarse classification of the quantization levels being effected for a range of values with values of the signal to be quantized having a low relative abundance.

30. An apparatus for producing a fingerprint signal from an audio signal, comprising:

a calculator for calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

a scaler for scaling the energy values to obtain a sequence of scaled vectors wherein the scaler includes a means for taking the logarithm and a suppressor for suppressing a steady component which is connected downstream of the means for taking the logarithm, wherein the suppressor for suppressing a steady component includes a high-pass filter;

a low-pass filter for temporally filtering the sequence of scaled vectors to obtain a filtered sequence which represents the fingerprint signal, or from which the fingerprint signal may be derived; and a quantizer connected downstream of the filters and configured to quantize the filtered sequence or a signal based thereon so as to derive the fingerprint signal from the filtered sequence, wherein the quantizer comprises such a classification of the quantization levels that a maximum relative quantization error is identical for large and small energy values within a tolerance range.

31. A method for producing a fingerprint signal from an audio signal, comprising:

calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

scaling the energy values to obtain a sequence of scaled vectors wherein scaling comprises taking the logarithm of the energy values, and suppressing, downstream with respect to taking the logarithm, a steady component, using a high-pass filtering operation; and temporally low-pass filtering the sequence of scaled vectors to obtain a filtered sequence which represents the fingerprint signal, or from which the fingerprint signal may be derived; and quantizing the filtered sequence or a signal based thereon so as to derive the fingerprint signal from the filtered sequence or the signal based thereon using such a classification of the quantization levels that a maximum relative quantization error is identical for large and small energy values within a tolerance range.

32. A method for producing a fingerprint signal from an audio signal, comprising:

calculating energy values for frequency bands of segments of the audio signal which are successive in time, an energy value for a frequency band depending on an energy of the audio signal in the frequency band, so as to obtain a sequence of vectors of energy values from the audio signal, a vector component being an energy value in a frequency band;

scaling the energy values to obtain a sequence of scaled vectors wherein scaling comprises taking the logarithm of the energy values; and suppressing, downstream with respect to taking the logarithm, a steady component, using a high-pass filtering operation;

temporally low-pass filtering the sequence of scaled vectors to obtain a filtered sequence which represents the fingerprint signal, or from which the fingerprint signal may be derived; and quantizing the filtered sequence or a signal based thereon so as to derive the fingerprint signal from the filtered sequence or the signal based thereon, wherein quantization levels on the grounds of an amplitude statistic are used, the quantization levels being adapted in accordance with the amplitude statistic of the signal to be quantized, which statistic includes a statement about a relative frequency of values of the signal to be quantized, a fine classification of the quantizing levels being effected for a range of values with values of the signal to be quantized having a high relative abundance, and a coarse classification of the quantization levels being effected for a range of values with values of the signal to be quantized having a low relative abundance.

* * * * *